United States Patent
Chang et al.

(10) Patent No.: US 9,196,873 B1
(45) Date of Patent: Nov. 24, 2015

(54) DISPLAY PANEL PIXEL UNIT AND DISPLAY PANEL USING THE SAME

(71) Applicant: AU OPTRONICS CORPORATION, Hsin-Chu (TW)

(72) Inventors: Chien-Cheng Chang, Hsin-Chu (TW); Tsung-Tien Wu, Hsin-Chu (TW); Kang-Hung Liu, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 14/715,677

(22) Filed: May 19, 2015

(30) Foreign Application Priority Data

Jul. 21, 2014 (TW) .............................. 103124949 A (51) Int. Cl.
| | |
|---|---|
| H01L 33/00 | (2010.01) |
| H01L 51/52 | (2006.01) |
| H01L 33/46 | (2010.01) |
| H01L 33/40 | (2010.01) |
| H01L 33/60 | (2010.01) |
| H01L 33/48 | (2010.01) |
| H01L 33/10 | (2010.01) |

(52) U.S. Cl.
CPC ............ *H01L 51/5293* (2013.01); *H01L 33/10* (2013.01); *H01L 33/405* (2013.01); *H01L 33/46* (2013.01); *H01L 33/486* (2013.01); *H01L 33/60* (2013.01); *H01L 51/5209* (2013.01); *H01L 51/5221* (2013.01); *H01L 51/5271* (2013.01); *H01L 51/5281* (2013.01)

(58) Field of Classification Search
CPC ....... H01L 33/60; H01L 33/486; H01L 33/46; H01L 33/405; H01L 33/10
See application file for complete search history.

(56) References Cited

U.S. PATENT DOCUMENTS

| | | | | |
|---|---|---|---|---|
| 7,495,375 | B2 | 2/2009 | Huang et al. | |
| 2008/0111145 | A1* | 5/2008 | Lin ..................... | H01L 33/507 257/98 |
| 2011/0057209 | A1* | 3/2011 | Kim .................... | H01L 25/167 257/88 |
| 2012/0012988 | A1* | 1/2012 | Huang ................. | B81B 7/0077 257/632 |
| 2012/0187281 | A1* | 7/2012 | Kerness .............. | H01L 27/14618 250/214.1 |
| 2012/0267654 | A1* | 10/2012 | Lee ..................... | H01L 25/075 257/91 |
| 2013/0146841 | A1* | 6/2013 | Yun ..................... | H01L 33/04 257/13 |
| 2015/0115293 | A1 | 4/2015 | Wu et al. | |

FOREIGN PATENT DOCUMENTS

| | | |
|---|---|---|
| TW | I256268 | 6/2006 |
| TW | I261378 | 9/2006 |
| TW | 201516993 | 5/2015 |

\* cited by examiner

*Primary Examiner* — Ngan Ngo
(74) *Attorney, Agent, or Firm* — McClure, Qualey & Rodack, LLP (57) ABSTRACT

A display panel pixel unit and display panel using the same is provided. The display panel pixel unit includes a first electrode layer, a light-emitting element, and a light-filtering layer. The light-emitting element is disposed on the first electrode layer. The light-emitting element has a light-emitting surface on the side opposite to the first electrode layer. The light-filtering layer is above the first electrode layer and forms a space with the first electrode layer to contain at least a portion of the light-emitting element. The light-filtering layer has a light-filtering area corresponding to the area of the first electrode layer that is exposed by the light-emitting element and light-transmissible area corresponding to the light-emitting surface.

16 Claims, 13 Drawing Sheets

DISPLAY PANEL PIXEL UNIT AND DISPLAY PANEL USING THE SAME

BACKGROUND

1. Technical Field

The present disclosure generally relates to a structure of a display panel pixel unit and a display panel having the same; particularly, the present disclosure relates to a structure of display panel pixel units and display panel having the same that has higher contrast levels.

2. Description of the Related Art

In recent years, flat panel display devices have been widely used in various fields. They may be used independently as displays, or may also be embedded in electronic devices to display information. There are various different types of flat panel display devices, such as organic light-emitting diode (OLED) displays, liquid crystal displays (LEDs), and electrophoretic displays. In terms of OLED displays, requirements for optical display performances are continually being raised as technology advances and consumers require better display quality. There are many different dimensions when talking about optical performance. Typically, they may include color saturation, contrast levels, brightness levels, and such standards that need to be continually advanced to satisfy consumer needs.

Figure 1:
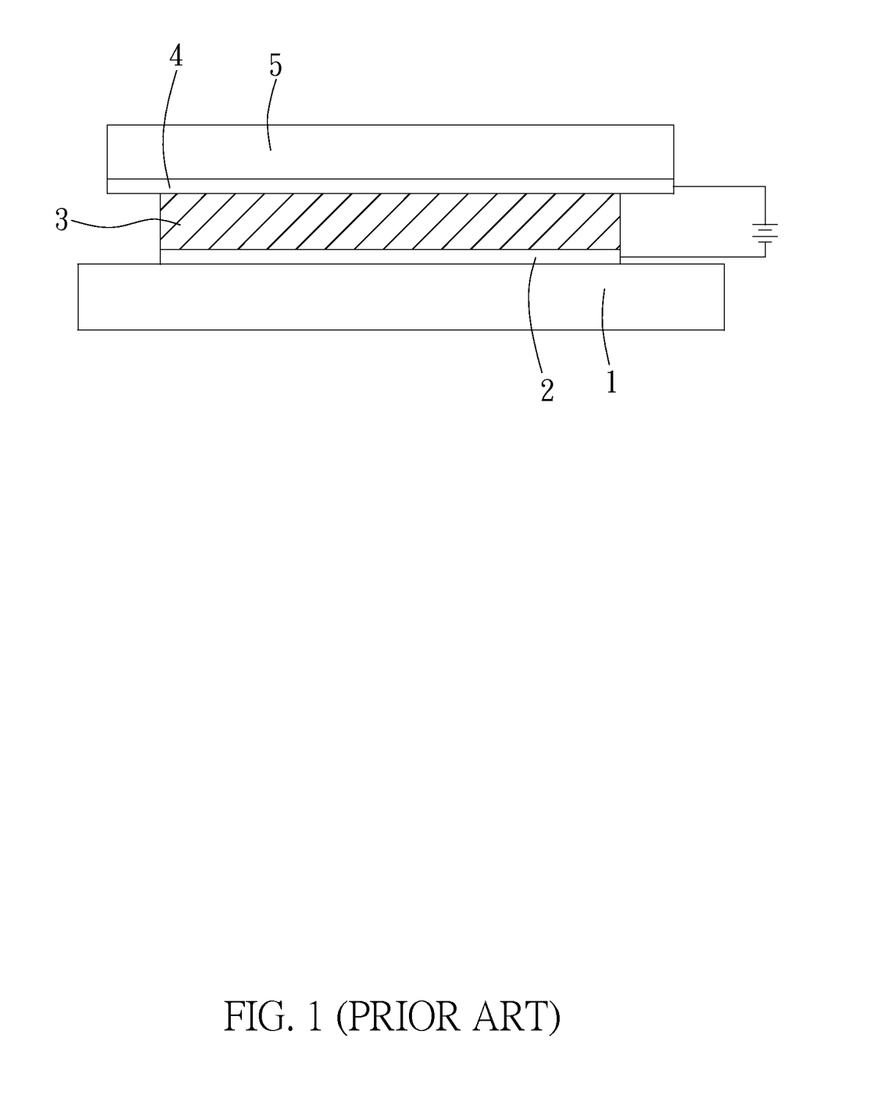
FIG. 1 is a view of a pixel unit of a conventional OLED display device.

Another developmental advantage to panel displays is the versatility to apply the technology to different fields. In particular, as handheld and wearable devices become the norm, panel displays are constantly being utilized in outdoor environments. However, during use in outdoor environments, effects from outdoor light on the contrast levels of displaying images need to be considered. As illustrated in FIG. 1, a pixel unit includes bottom substrate 1, bottom electrode layer 2, light-emitting layer 3, top electrode layer 4, and top substrate 5. The bottom electrode layer 2 is disposed on the bottom substrate 1. The light-emitting layer 3, the top electrode layer 4, and the top substrate 5 are stacked on top thereof. The bottom electrode layer 2 accepts driving signals to cooperatively with the top electrode layer 4 to drive the light-emitting layer 3 to emit light. The light passes through the electrode layer 4 and the top substrate 5 to be emitting out in order to form display images. However, when used in places with bright environment lighting, light X from the environment will pass through the top substrate 5 and enter the pixel unit. Since the bottom electrode layer 2 is typically metallic and will be reflective, the external light X entering the pixel unit will be reflected out by the bottom electrode layer 2. In this instance, the reflected external light X will be emitted along with light emitted from the light-emitting layer 3 and be seen by users. This will affect the color and contrast performance of the displayed image.

SUMMARY

It is an object of the present disclosure to provide a display panel pixel unit and display device having the same in order to decrease reflection of external environment light.

It is another object of the present disclosure to provide a display panel pixel unit and display device having the same to, under conditions of maintaining the contrast levels of image displaying, increase light brightness levels.

The display panel includes a plurality of display panel pixel units. The display panel pixel unit includes a first substrate, a first electrode layer, a light-emitting element, and a light-filtering layer. The first electrode layer is formed on the first substrate, and is connected to a control circuit on the first substrate in order to receive control signals. The light-emitting element is disposed on the first electrode layer and is connected to the first electrode layer. Within an individual display panel pixel unit, one or more light-emitting elements may be disposed. Since the surface area of the first electrode layer is relatively large, the light-emitting element only covers a portion of the surface area of the first electrode layer when the light-emitting elements are disposed on the first electrode layer. The light-emitting element has a light-emitting surface, wherein the light-emitting surface is at an end of the light-emitting element facing away from the first electrode layer.

The light-filtering layer is formed above the first electrode layer and forms an accommodating space with the first electrode layer to accommodate at least a portion of the light-emitting element(s). The light-filtering layer has a light-filtering area and a non light-filtering area. The light-filtering area corresponds to the portion of the first electrode layer without and not exposed by the light-emitting element. As a result, a majority of the reflected light arrives at the light-filtering layer through the first electrode layer, and then are selectively blocked or filtered by the light-filtering layer. The non light-filtering area corresponds to the light-emitting surface, and therefore light generated by the light-emitting surface can be emitted out through the non light-filtering area and will not be blocked or filtered by the light-filtering layer. By way of this design, light reflection of external environment light by the first electrode layer may be decreased in order to increase the contrast and color performance of the displayed image.

DETAILED DESCRIPTION OF THE PREFERRED EMBODIMENT

The present disclosure provides a structure of a display panel pixel unit and a display panel having the same. In an embodiment, the display device is a self-luminous type of display panel, and preferably can include light-emitting diodes as the light source.

Figure 2:
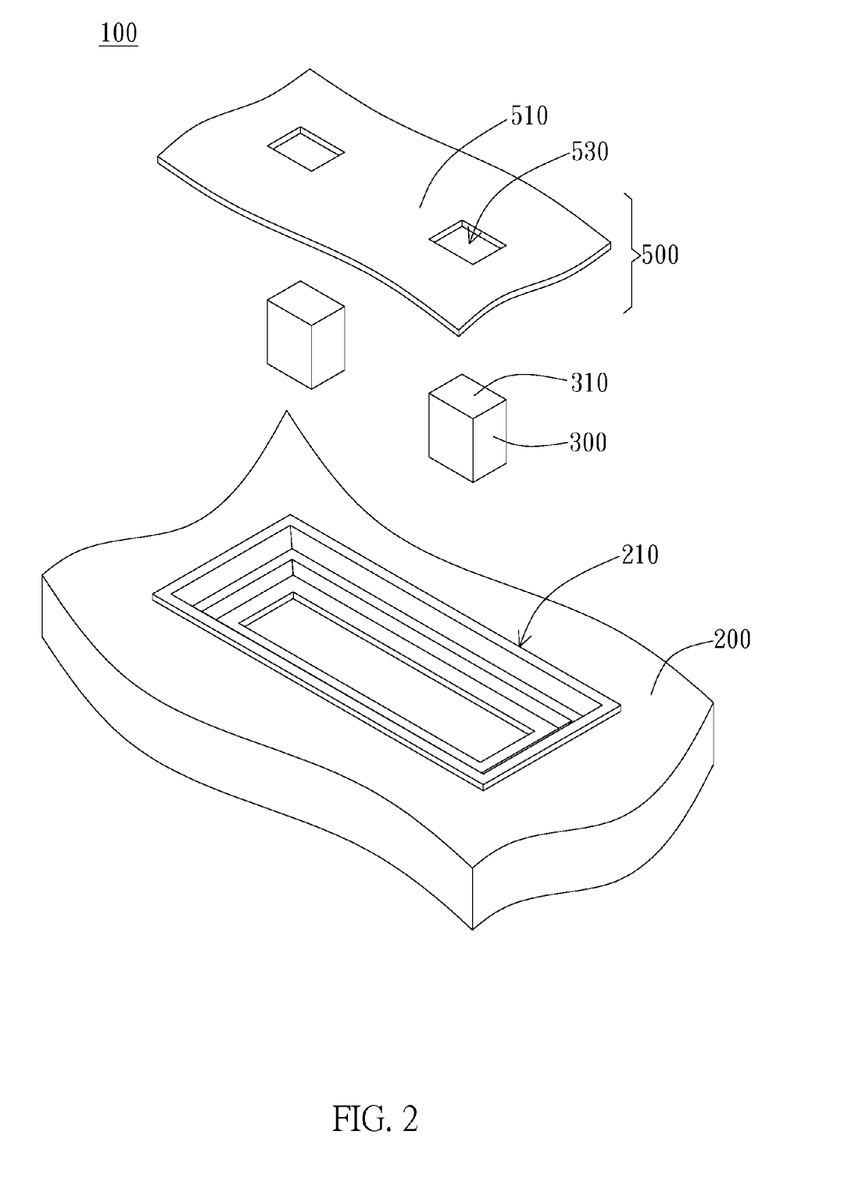
FIG. 2 is an exploded view of an embodiment of the display panel pixel unit of the present invention.
Figure 3:
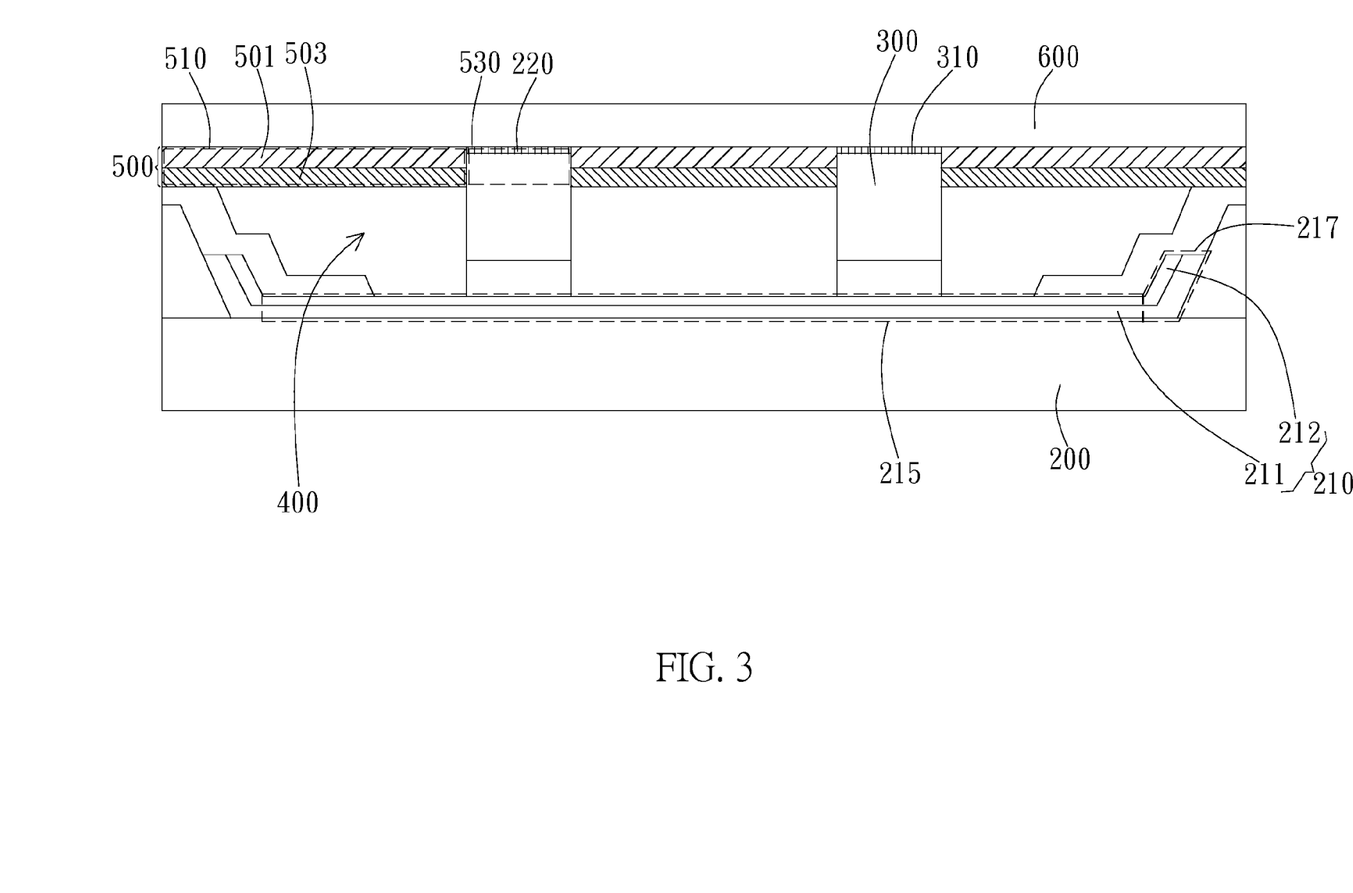
FIG. 3 is a cross-sectional view of an embodiment of the display panel pixel unit of the present invention.

In the embodiment shown in FIG. 2, the display panel pixel unit 100 includes a first substrate 200, a first electrode 210, a light-emitting element 300, and a light-filtering layer 500. A control circuit is preferably formed on the first substrate 200 (not illustrated), such as a thin film transistor circuit, in order to provide control signals. The first electrode layer 210 is preferably formed from metallic materials, such as silver, molybdenum-aluminum alloy, or other related metals. However, the first electrode layer 210 may also include indium-tin-oxide (ITO) or other related oxides with electrical conductivity properties. The first electrode layer 210 is formed on the first substrate 200 and is connected to the control circuit on the first substrate 200 in order to receive the control signals. As shown in FIG. 3, in the present embodiment, the first electrode layer 210 is cooperatively formed by bottom substrate layer 211 and contact layer 212. The bottom substrate layer 211 is preferably formed from silver, molybdenum-aluminum alloy, or other related metals, wherein the bottom substrate layer 211 directly connects to the control circuit on the first substrate 200 and is preferably formed as a cup (bowl) shape. The contact layer 212 is preferably formed from ITO or other such conductive oxides, wherein the contact layer 212 covers on top of the bottom substrate layer 211 to provide protection for the bottom substrate layer 211.

The light-emitting element 300 is preferably a light-emitting diode element disposed on the first electrode layer 210 and connects with the first electrode layer 210. Within an individual display panel pixel unit, one or more light-emitting elements 300 may be disposed. As shown in FIG. 3, since the surface area of the first electrode layer 210 is relatively large, when the light-emitting element 300 is disposed on the first electrode layer 210, the light-emitting element 300 preferably only covers a portion of the surface of the first electrode layer 210, wherein the rest of the surface is not covered by the light-emitting element 300. Additionally, in the present embodiment, the first electrode layer 210 is formed as a cup shape and includes a bottom portion 215 and a cup sidewall 217. The light-emitting element 300 is disposed on the bottom portion 215 and is surrounded by the cup sidewall 217 to be accommodated within the structure of the cup shape. The light-emitting element 300 has a light-emitting surface 310 and is positioned at an end of the light-emitting element 300 facing away from the first electrode layer 210. In terms of an embodiment, the light-emitting surface 310 is the primary surface of the light-emitting element 300 emitting out generated light, wherein the direction of the normal line to the light-emitting surface 310 is the front of the light-emitting element 300. However, other than the light-emitting surface 310, other surfaces of the light-emitting element 300 may also generate light such that the light-emitting surface 310 is not the only surface generating light.

As shown in FIGS. 2 and 3, the light-filtering layer 500 is formed above the first electrode layer 210 and forms an accommodation space 400 with the first electrode layer 210, wherein at least a portion of the light-emitting element 300 is positioned within the accommodation space 400. In other words, in the present embodiment, the light-filtering layer 500 gapped from the first electrode layer 210 by the accommodation space 400 to be positioned above the first electrode layer 210. As a result, the light-filtering layer 500 and the first electrode layer 210 do not actually come in contact with each other. The light-filtering layer 500 is preferably parallel with the first substrate 200, and is preferably formed from a circular polarizer film. However, in other different embodiments, the light-filtering layer 500 may also be formed from anti-reflective film. In the present embodiment, the first electrode layer 210 is formed in a cup shape and has cup sidewall 217. The projection of the cup sidewall 217 and the bottom portion 215 on the flat surface of the light-filtering layer 500 completely lies within the area of the light-filtering layer 500. As shown in FIG. 3, the light-filtering layer 500 has a light-filtering area 510 and a non light-filtering area 530. The light-filtering area 510 corresponds to the portion of the first electrode layer 210 without the light-emitting element 300. In an embodiment, the light-filtering area 510 covers on top of the first electrode layer 210 not disposed with the light-emitting element 300. As a result, a majority of the light reflected by the first electrode layer 210 will arrive at the light-filtering area 510 and then be selectively filtered or blocked by the light-filtering area 510. The non light-filtering area 530 corresponds to the light-emitting surface 310, and therefore light generated by the light-emitting surface 310 can be emitted out of the non light-filtering area 530 without being blocked by the light-filtering layer 500. As shown in FIG. 3, the projection of the light-filtering area 510 on the first electrode layer 210 will not overlap with the disposed position of the light-emitting element 300 on the first electrode layer 210. The projection of the non light-filtering area 530 on the first electrode layer 210 will overlap with the disposed position of the light-emitting element 300 on the first electrode layer 210.

As illustrated in the embodiment of FIG. 3, the display panel pixel unit additionally includes a second substrate 600 and a second electrode layer 220. The second substrate 600 is disposed facing opposite to the first substrate 200 such that the first electrode layer 210, the light-emitting element 300, and the light-filtering layer 500 is sandwiched between the first substrate 200 and the second substrate 600. The second electrode layer is preferably disposed or adhered to an inner surface of the second substrate 600 (in other words, the surface facing the first substrate 200), and the second electrode layer 220 is disposed or adhered to the light-emitting surface 310. The second electrode layer 220 preferably is transparent to be light transmissible, and can be formed from ITO or any other related compounds having electrical conductivity properties. In the present embodiment, with the first electrode layer 210 acting as an anode and the second electrode layer 220 acting as the cathode to provide power, the light-emitting element 300 generates light that passes through the second electrode layer 220 to be emitted out. However, in other different embodiments, the electrical circuit providing power may also be completely disposed on the first substrate 200. In this instance, it would not be necessary to have the second electrode layer 220.

As shown in FIG. 3, the light-filtering layer 500 may also be disposed or adhered to the inner surface of the second substrate 600 (in other words, on the surface facing the first substrate 200). In the present embodiment, the non light-filtering area 530 is formed as a hole. In other words, the non light-filtering area 530 is formed as a hole from the surrounding of the light-filtering area 510. The top end of the light-emitting element 300 extends into the hole that is the non light-filtering area 530. In other words, the light-emitting surface 310 is accommodated within the hole. Since the non light-filtering area 530 does not block the light, the light generated by the light-emitting surface 310 can successfully be emitted outward. In addition, in the present embodiment, since the second electrode layer 220 is, similarly to the light-filtering layer 500, adhered on the second substrate 600 and accommodated within the non light-filtering area 530, the second electrode layer 220 is flush with the surface of the light-filtering layer 500 facing the second substrate 600.

Figure 4:
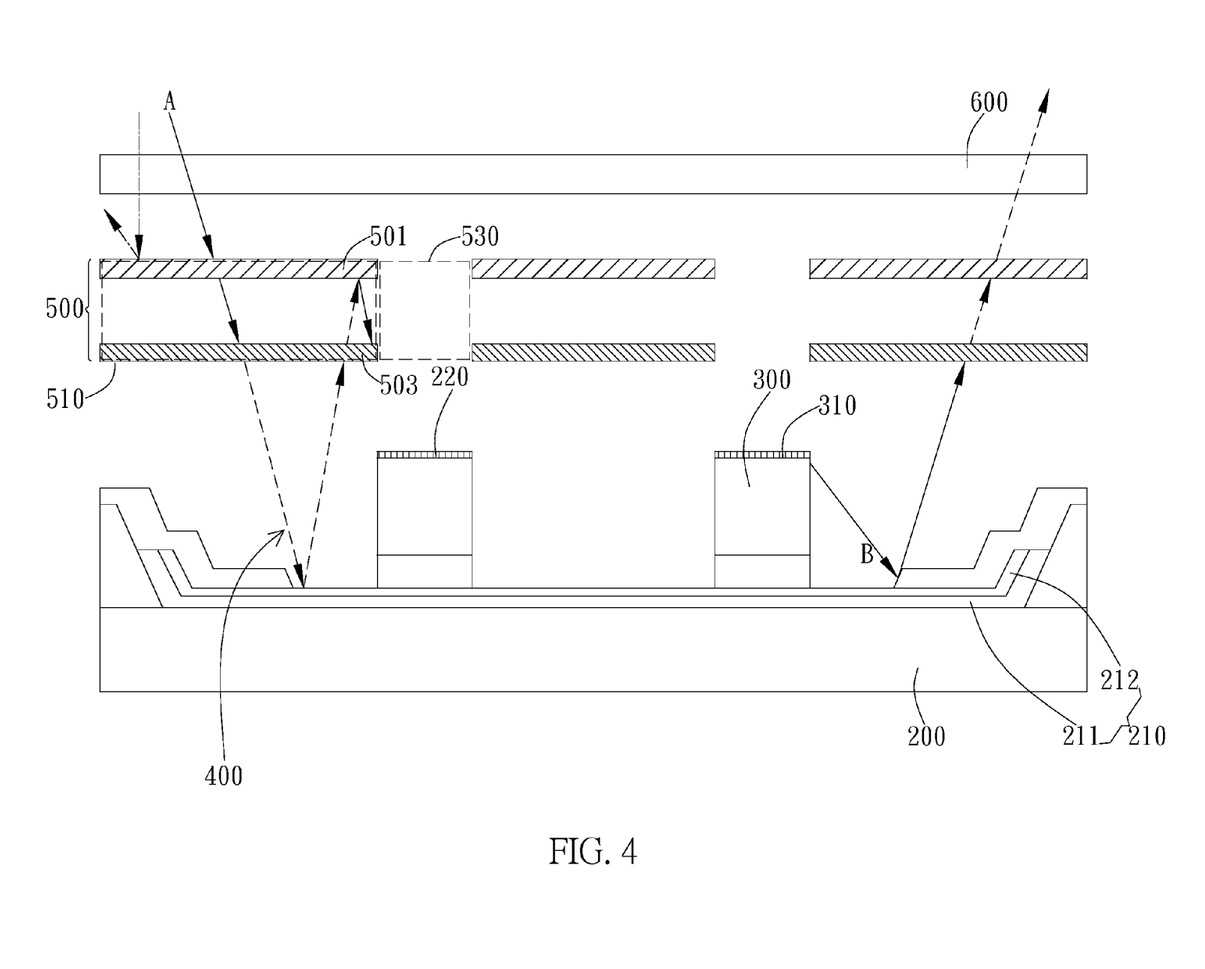
FIG. 4 is a view of external environment light entering the pixel unit (for interests of better explanation, portions of the components are drawn in exploded view)

As previously mentioned and shown in the embodiment of FIG. 3, the light-filtering layer 500 is formed by circular polarizer film, wherein the circular polarizer film is preferably formed from (straight) polarizer film 501 and ¼ wavelength film 503. As shown in FIG. 3, the polarizer film 501 and the ¼ wavelength film 503 are only distributed in the light-filtering area 510. The polarizer film 501 and the ¼ wavelength film 503 overlap with each other, wherein the ¼ wavelength film 503 is positioned on a side of the polarizer film 501 facing the first electrode layer 210. As shown in the light path illustrated in FIG. 4, in terms of the external environment light A entering the display panel pixel unit from the outside environment, the polarizer film 501 allows external light A having the same polarity to enter while blocking or filtering out any other portions of the external light. The external light A that has passed through the polarizer film 501 will enter into the accommodation space 400 after being modulated by the ¼ wavelength film 503 into ¼ wavelength light, wherein the light will then be reflected back to the ¼ wavelength film 503 by the first electrode layer 210 or other aspects. The reflected light will then be modulated a second time in the ¼ wavelength when passing through the ¼ wavelength film 503 before arriving again at the polarizer film 501. In adding up the number of times that these external light A have been modulated in comparison to first entering the polarizer film 501, the external light A has been modulated totally by ½ wavelength. As a result, when the modulated external light A returns to the polarizer film 501, they will be totally blocked or filtered by the polarizer film 501 and will not be able to pass through. By way of this design, the brightness level caused by external light being reflected by the first electrode layer 210 may be correspondingly reduced such that they do not affect the images generated from light emitting from the light-emitting surface 310 of the light-emitting element 300. In this manner, contrast levels may be increased. In addition, the light-emitting element 300 may also generate light B through the surfaces of other non light-emitting surfaces 310, wherein the light B may be emitted outward after being reflected and passed through the light-filtering area 510. Although the polarizer film 501 may block a portion of the light B, the polarizer film 501 will still allow portions of the light B with suitable polarity to pass though.

Figure 5:
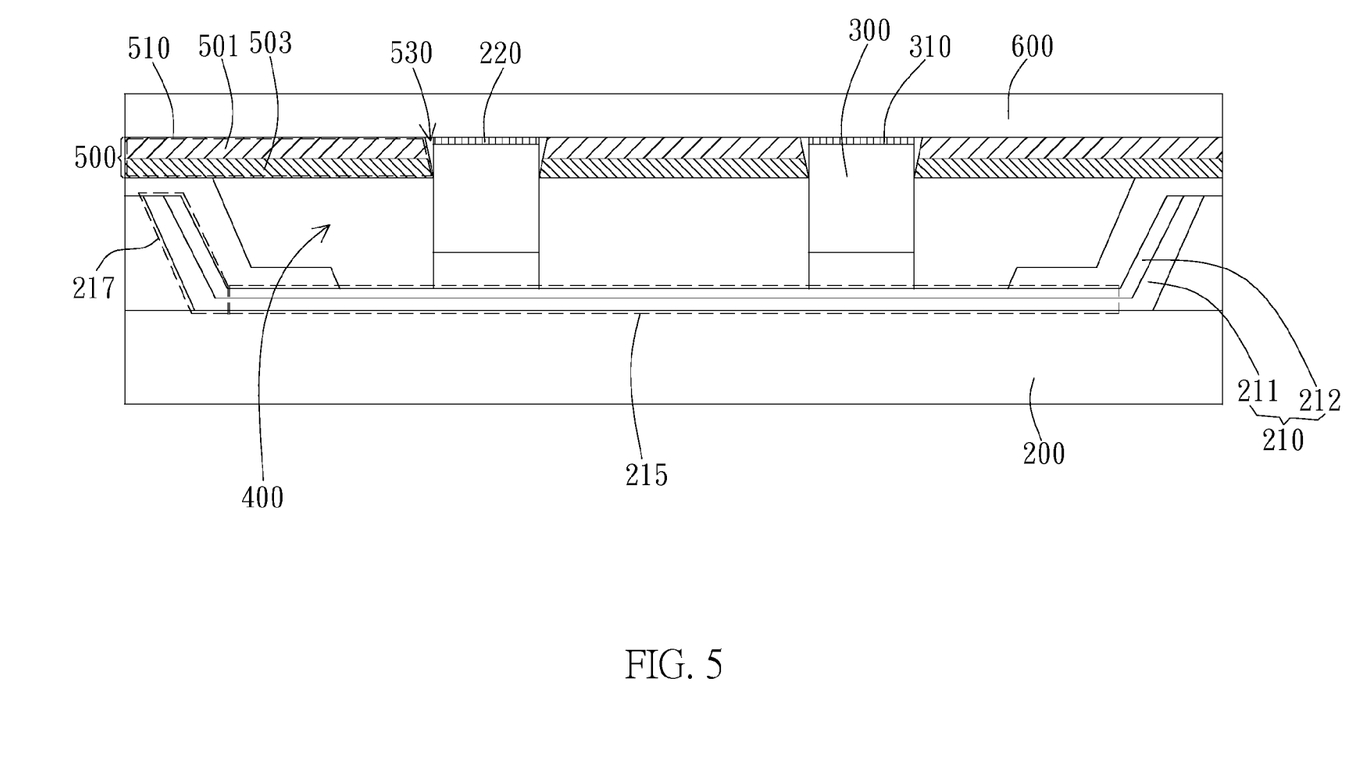
FIG. 5 is a cross-sectional view of another embodiment of the display panel pixel unit.

As shown in the embodiment in FIG. 5, the hole formed from the non light-filtering area 530 is formed in a bucket shape or cone shape, wherein the hole gradually expands the further away it is to the first electrode layer 210. In other words, the surface area of the cross-section of the hole along the direction parallel to the light-emitting surface 310 gradually increases along the direction Y away from the first electrode layer 210. By way of this design, the non light-filtering area 530 can allow even more light generated from the light-emitting element 300 to be emitted out through the non light-filtering area 530 and thereby increase contrast levels. In addition, as shown in the embodiment in FIG. 5, the cup sidewall 217 extends towards the light-filtering layer 500 to a position closer to the light-filtering layer 500. For instance, the sidewall height of the cup sidewall 217 may be higher than half the height of the accommodation space 400. By way of this design, the reflective surface area of the cup sidewall 217 may be increased in order to increase the light reusability of the light-emitting element 300 emitting light from the sides.

Figure 6A:
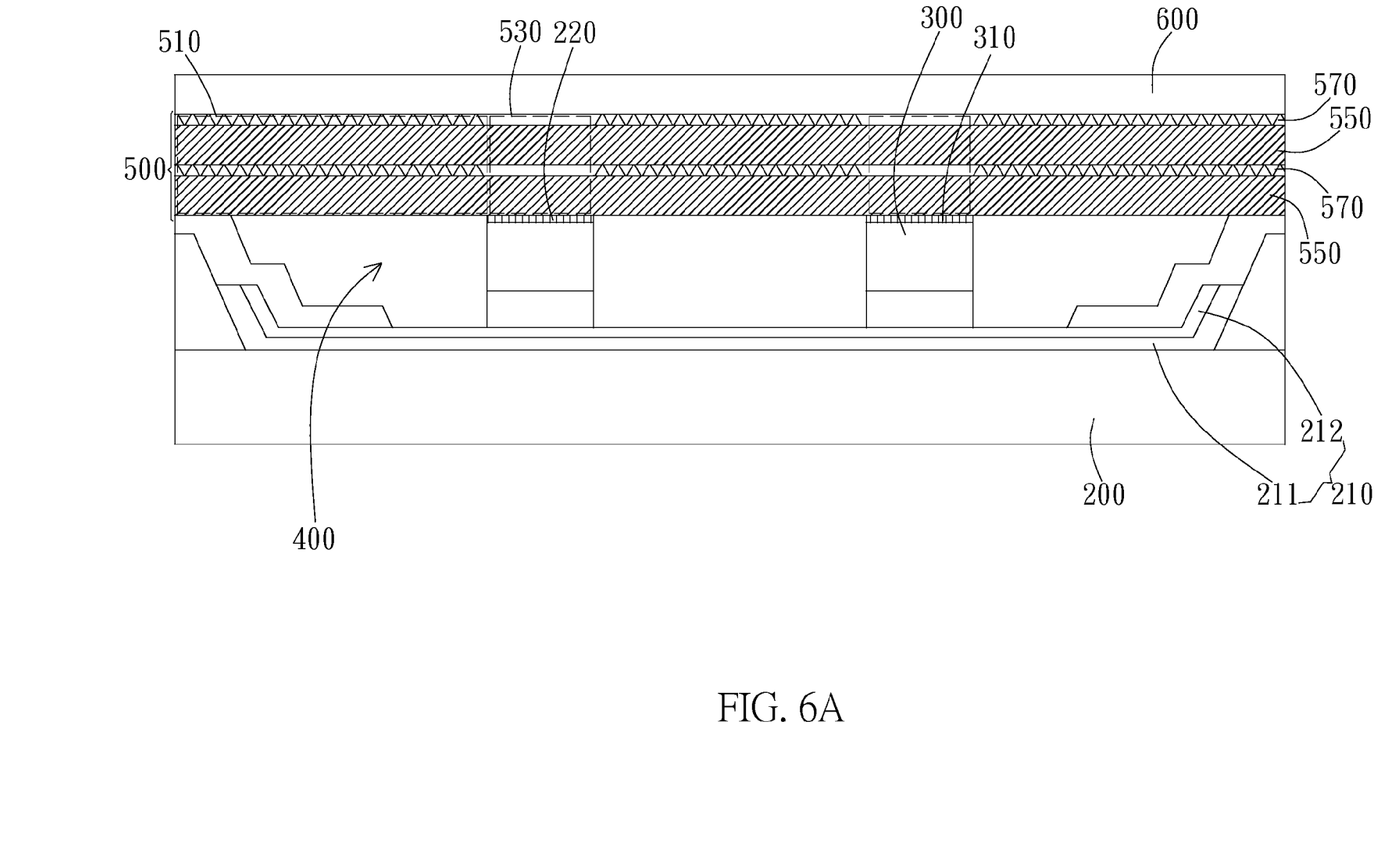
FIG. 6A is a cross-sectional view of another embodiment of the display panel pixel unit.

FIG. 6 illustrates another embodiment of the display panel pixel unit. In the present embodiment, the light-filtering layer 500 includes a diapragm body 550 and a plurality of optical structures 570. The polarizer film and ¼ wavelength film of the circular polarizer film embodiment previously mentioned may be achieved by the combination of the diaphragm body 550 and plurality of optical structures 570 shown in FIG. 6A. For instance, a plurality of diaphragm body 550 having optical structures 570 may be stacked together. As shown in FIG. 6A, the light-filtering area 510 and the non light-filtering area 530 are distributed on the diaphragm body 550. The diaphragm body 550 has a light transmissivity properties, wherein the optical structure 570 are disposed above the diaphragm body 550 to form light-filtering area 510. The diaphragm body 550 does not have any optical structures 570 within the boundaries of the non light-filtering area 530. Therefore, the diaphragm body 550 does not have light blocking properties and allows light to enter and leave. In another embodiment, the display panel pixel unit includes a second substrate 600 and a second electrode layer 220. The second substrate 600 is disposed opposite to the first substrate 200, sandwiching the first electrode layer 210, the light-emitting element 300, and the light-filtering layer 500 in between. The second electrode layer 220 is preferably disposed or adhered on the inner surface of the diaphragm body 550 (i.e. The surface facing the first substrate 200), and the second electrode layer 220 is disposed or adhered to the light-emitting surface 310. The second electrode layer 220 is preferably transparent and can allow light to pass through, wherein the second electrode layer 220 may be formed from ITO or other related compounds having electrical conductivity properties. In the present embodiment, by way of the first electrode layer 210 acting as the anode and the second electrode layer 220 acting as the cathode to provide power, the light-emitting element 300 will generate light that will emit outwards passing through the second electrode layer 220.

As shown in the embodiment in FIG. 6A, since a hole is not needed to form the non light-filtering area 530 like mentioned in the previous embodiment and instead the area on the diaphragm body 550 without any structures acts as the non light-filtering area 530, the diaphragm body 550 still exists within the non light-filtering area 530 corresponding to the light-emitting surface 310. As shown in FIG. 6A, the light-emitting surface 310 and the second electrode layer 220 may be connected to the bottom surface of the diaphragm body 550 through gluing or any other methods. Conversely, although the outer side of the light-emitting surface 310 has the diaphragm body 550 and the light-emitting surface 310 will not protrude out of the hole on the diaphragm body 550, there are no worries as to the effect of the hole on the flatness of the outer side surface of the diaphragm body 550. As a result, the outer side surface flatness of the entire product may be more easily achieved during assembly and manufacturing.

Figure 6B:
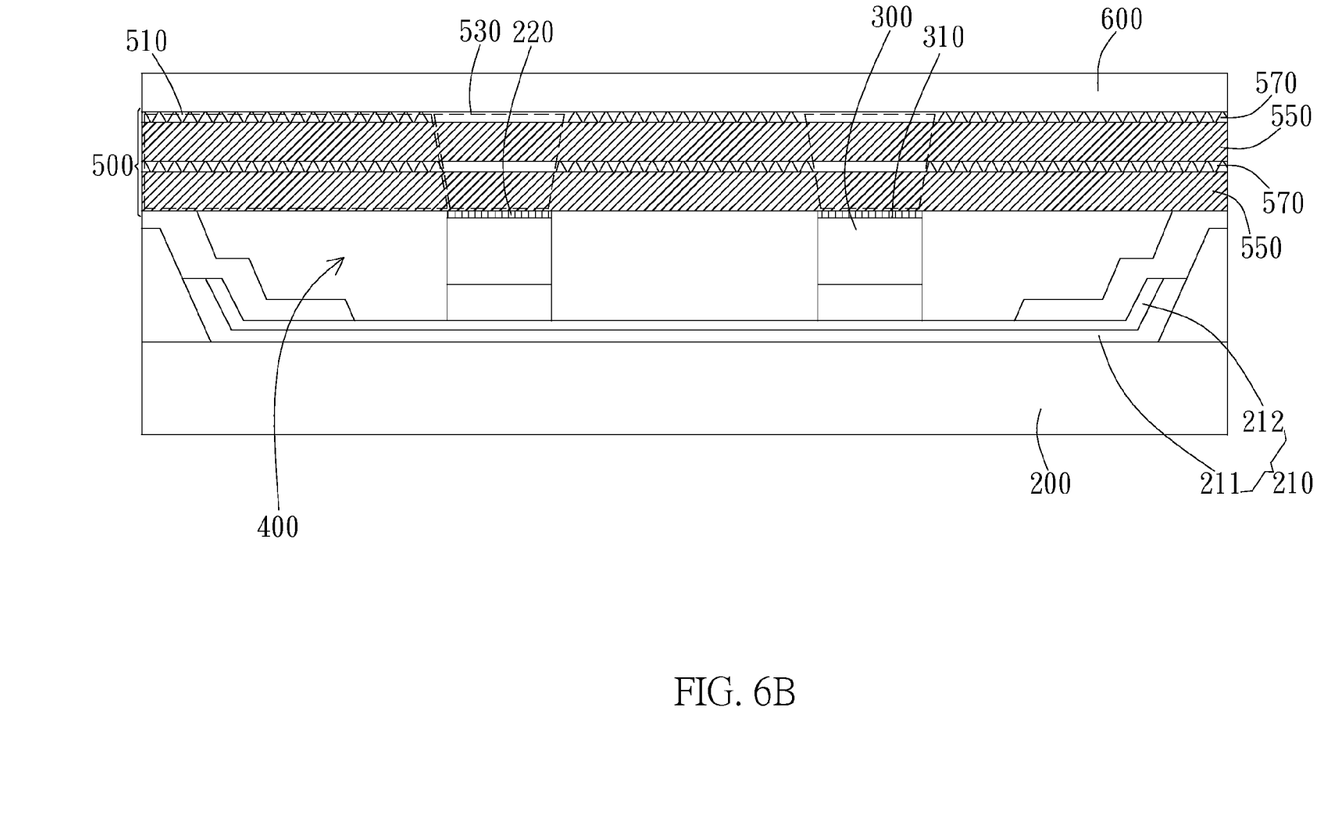
FIG. 6B is a variation of the embodiment of FIG. 6A.

As shown in the embodiment of FIG. 6B, the non light-filtering area 530 included in the diaphragm body 550 is formed as a bucket shape or cone shape, wherein it gradually expands further away from the first electrode layer 210. In other words, the cross-sectional surface area of the non light-filtering area 530 along the direction parallel to the light-emitting surface 310 gradually increases further away from the first electrode layer 210 along the direction Y. By way of this design, the non light-filtering area 530 can allow even more light generated by the light-emitting element 300 to be emitted out through the non light-filtering area 530 in order to increase contrast levels.

Figure 7:
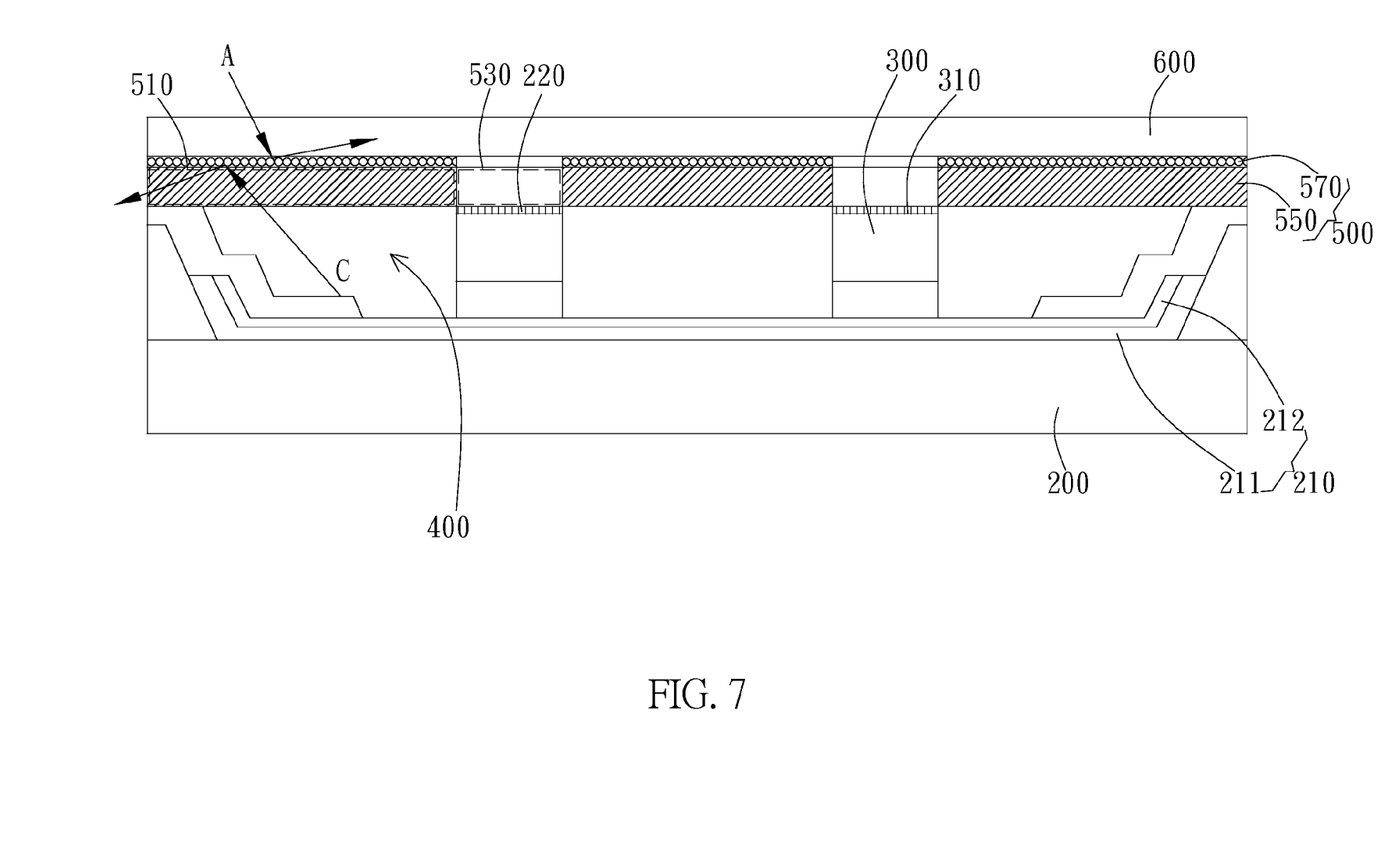
FIG. 7 is a cross-sectional view of another embodiment of the display panel pixel unit.

As shown in the embodiment of FIG. 7, the light-filtering layer 500 is disposed as an anti-reflective film. As shown in FIG. 7, the optical structure 570 may be disposed on or within the diaphragm body 550 through particles/granules or bubbles in order to achieve resisting reflective effects. When external light A wishes to pass through the light-filtering layer 500, the external light A will be reflected or refracted by the optical structures 570 to decrease the chance of the external light A directly entering into the display panel pixel unit. When light C from the inner portion reflects outward, the optical structures 570 will refract or reflect the light C to an angle greater than the normal line to the display surface in order to decrease the effects to the contrast level.

Figure 8:
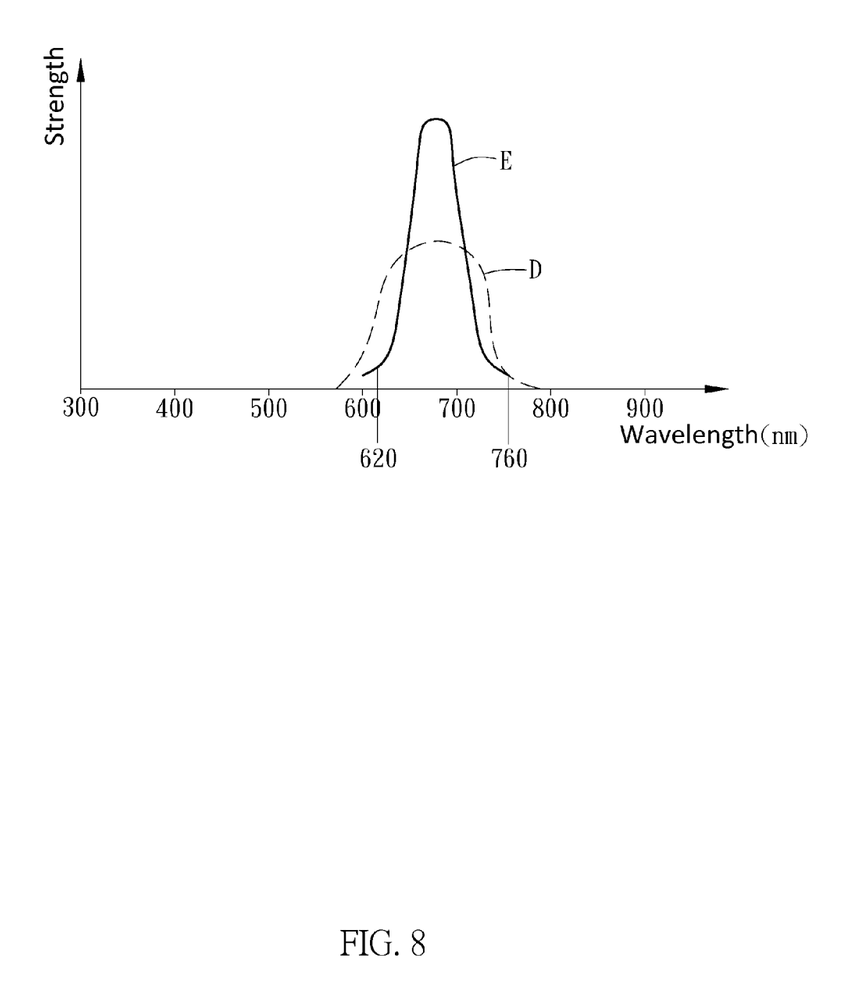
FIG. 8 is an embodiment of the light emission spectrum of the light-emitting element and the light-permissibility spectrum of the light-filtering area.

In another embodiment, the transmissible spectrum of the light-filtering area 510 in the light-filtering layer 500 may be adjusted to generate the effect of light-blocking or light-filtering. Supposing the light-emitting element 300 in the pixel unit is red, the emission spectral band E of the color light generated preferably would lie between 620 nm-760 nm. As shown in FIG. 8, in this instance the transmissible spectral band D of the light-filtering area 510 may be set to a similar interval range such that it would at least partially overlap with the emission spectral band E. When external light wishes to pass through the light-filtering area 510, only portions of the light conforming to the transmissible spectral band D may pass through, wherein other lights will be blocked out and will not be reflected by the first electrode layer in order to decrease the effect on the contrast and color performance of image displaying. In addition, light generated from the surfaces of the non light-emitting surface 310 of the light-emitting element 300 may also pass out through the light-filtering area 510 after internal reflection in order to increase light-use efficiency.

Figure 9:
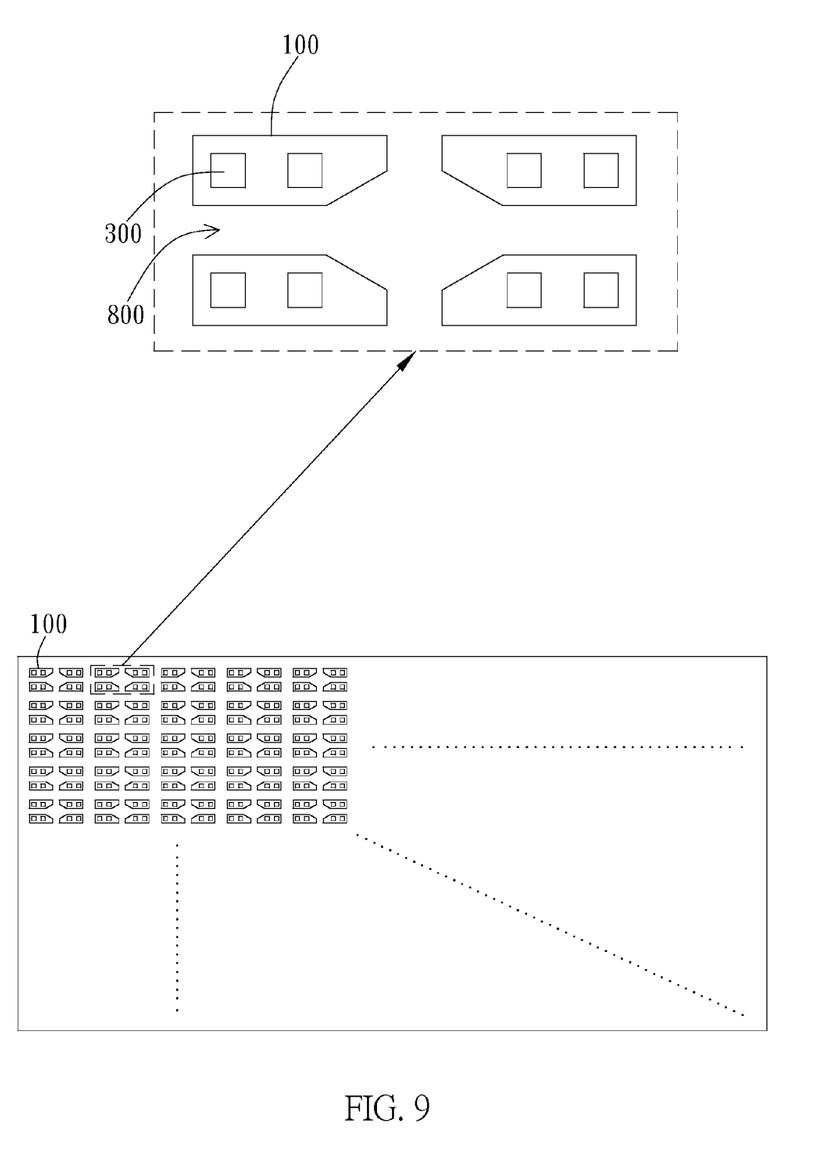
FIG. 9 is an embodiment of the display panel of the present invention.
Figure 10:
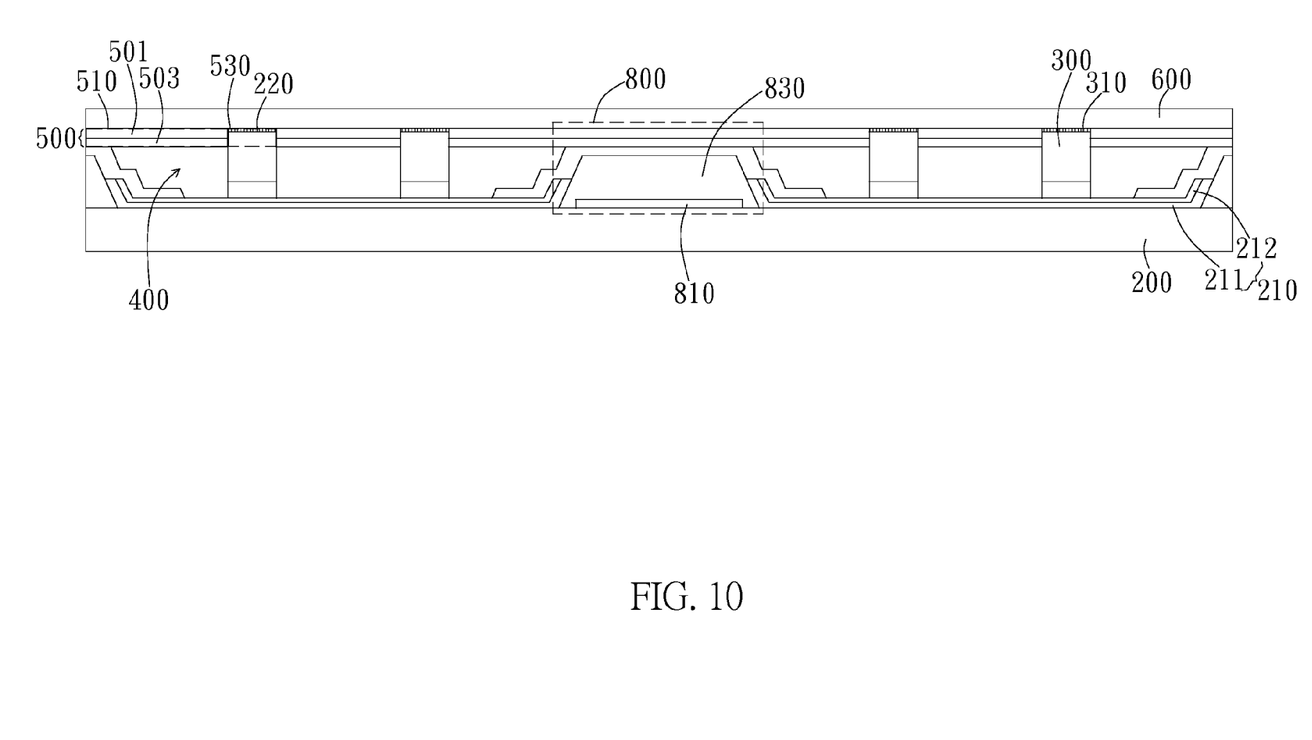
FIG. 10 is a cross-sectional view of the embodiment of FIG. 9.

FIG. 9 illustrates an embodiment of a display panel of the present invention. As shown in FIG. 9, the display panel includes a plurality of display panel pixel units 100. Different colored light-emitting units 300 are preferably disposed between neighboring display panel pixel units 100 in order to form display images. A gapping (space) band 800 is preferably between neighboring display panel pixel units 100 in order to distinguish between different display panel pixel units 100. As shown in FIG. 10, the structure of the gapping band 800 preferably includes metallic layer 810 and protective layer 830. The metallic layer 810 preferably formed as the control circuit structure and the signal transmission circuit. The protective layer 830 covers the metallic layer 810. In the present embodiment, the light-filtering area 510 of the light-filtering layer 500 extends to cover on top of the gapping band 800 to decrease light reflection generated on the metallic layer 810 from external light passing through the protective layer 830. In this manner, the contrast levels may be increased.

Figure 11:
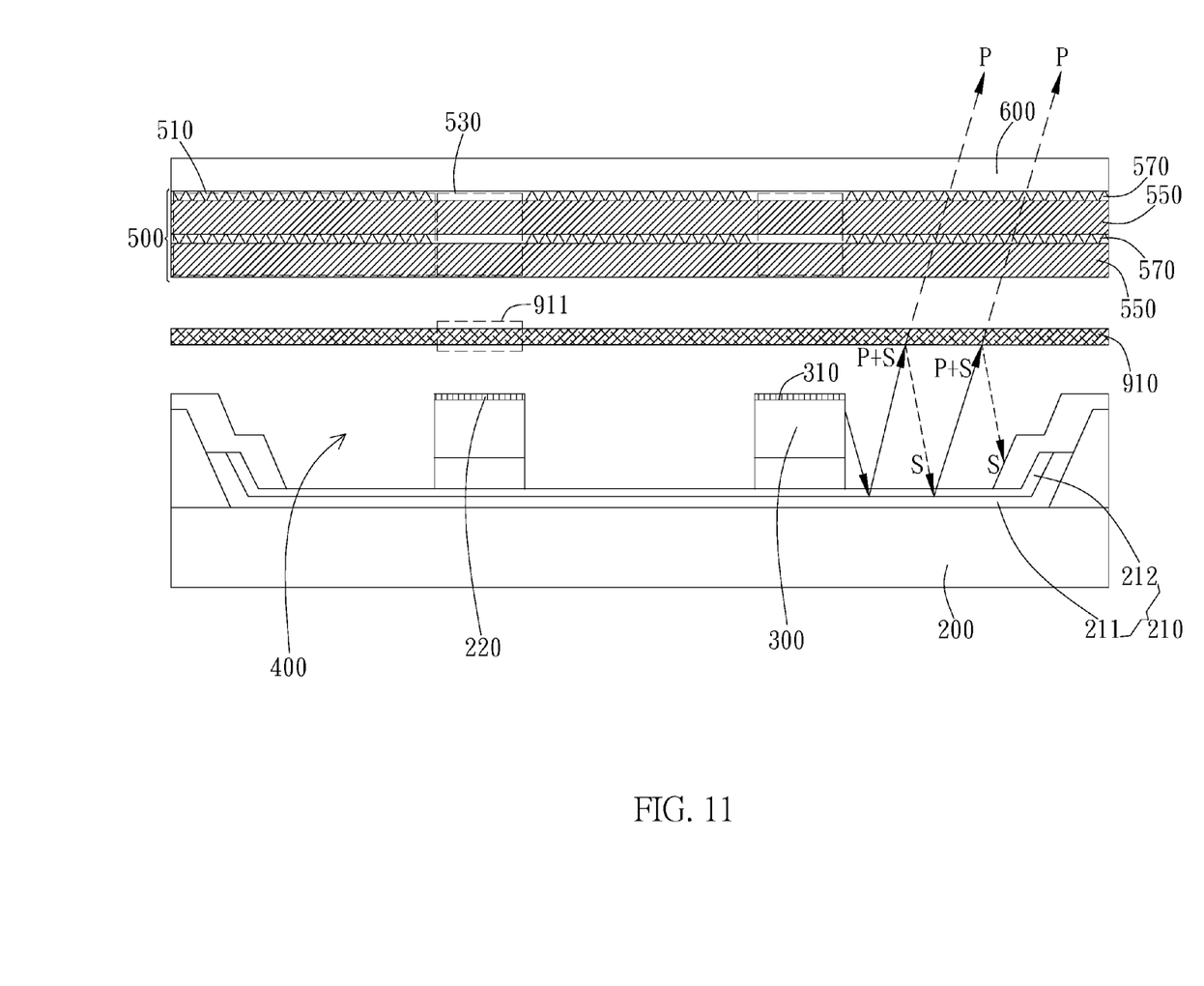
FIG. 11 illustrates an embodiment of the display panel pixel unit with increased reflective polarizer light-increasing diaphragm of the present invention.

In the embodiment shown in FIG. 11, a dual brightness enhancement film (DBEF) 910 is additionally added below the light-filtering layer 500. Preferably, there is a space between the DBEF 910 and the first electrode layer 210, wherein the DBEF 910 has a transmissible area 911 (such as a hole) corresponding to the light-emitting surface 310. As a result, light of the light-emitting surface 310 may be emitted out without being affected by the DBEF 910. In the present embodiment, in addition to decreasing the effects of external environment light, the present invention also has the added benefit of the increased light utilization of the light-emitting element 300. As shown in FIG. 11, the side facing light of the light-emitting element 300 will arrive at the reflective polarizer film 910 after being reflected by the first electrode layer 210 (or reflected by other components). In the present embodiment, the reflective polarizer film 910 allows light of wavelength P to pass while reflecting light of wavelength S. Similarly, the light-filtering layer 500 allows light of wavelength P to pass. After light of S wavelength is reflected by the DBEF 910 and recycled (reflected) by the first electrode layer 210 (or reflected by some other component) to become light having P wavelength and S wavelength, the P wavelength portion of light will then once able pass through the DBEF 910 and light-filtering layer 500 and be emitted out. In other words, in comparison to no presence of DBEF 910 wherein it's only simply blocking or absorbing light of S wavelength, the present embodiment can recycle the S wavelength light for resuse. Therefore, the light usability/efficiency of the light-emitting element 300 is increased.

Figure 12:
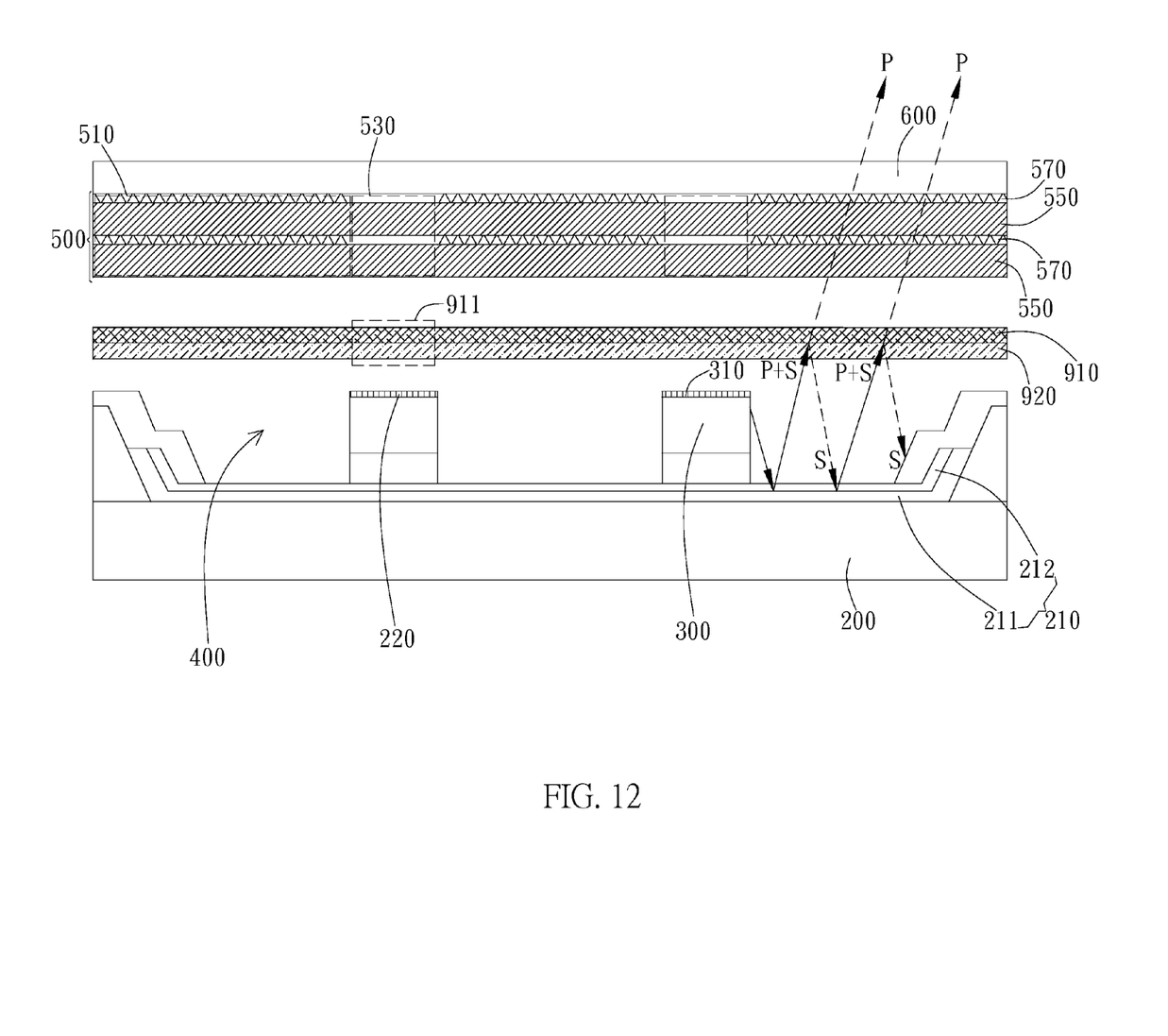
FIG. 12 illustrates an embodiment of the display panel pixel unit with increased reflective polarizer light-increasing diaphragm and light-increasing diaphragm.

As shown in the embodiment of FIG. 12, a brightness enhancement film (BEF) 920 is added below the DBEF 910. The BEF 920 preferably has a space with the first electrode layer 210. The BEF 920 is preferably formed from parallel arrangement of prism lens, wherein the prism lens may concentrate light reflected by the first electrode layer 210 (or reflected by other components) in the normal direction to the BEF in order to increase brightness. By way of setting the BEF 920, more light scattered sideways by the light-emitting element 300 may be recycled for use, thereby increasing the light usage/efficiency of the light-emitting element 300.

Although the embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A display panel pixel unit, comprising:
   a first electrode layer;
   a light-emitting element disposed on the first electrode layer and having a light-emitting surface facing away from the first electrode layer; and
   a light-filtering layer formed on the first electrode layer and forms an accommodation space with the first electrode layer to accommodate at least a portion of the light-emitting element;
   wherein the light-filtering layer has a light-filtering area and a non light-filtering area, the light-filtering area corresponds a portion of the first electrode layer not exposed by the light-emitting element, and the non light-filtering area corresponds to the light-emitting surface.

2. The display panel pixel unit of claim 1, wherein at least a portion of a projection of the light-filtering area overlaps with a projection of the portion of the first electrode layer not having the light-emitting element.

3. The display panel pixel unit of claim 1, wherein the non light-filtering area is a hole formed from the surrounding of the light-filtering area, at least a portion of the light-emitting element extends into the hole, and light generated by the light-emitting surface emits out from the hole.

4. The display panel pixel unit of claim 3, further comprising a second electrode layer disposed at the light-emitting surface, wherein the second electrode layer is flush with a surface of the light-filtering layer.

5. The display panel pixel unit of claim 3, wherein the cross-sectional surface area of the hole along a direction parallel to the light-emitting surface increases in the direction extending away from the first electrode layer.

6. The display panel pixel unit of claim 1, wherein the light-filtering layer comprises:
   a diaphragm body, wherein the light-filtering area and the non light-filtering area is distributed on the diaphragm body; and
   a plurality of optical structures formed on the diaphragm body to form the light-filtering area and avoiding the non light-filtering area.

7. The display panel pixel unit of claim 6, further comprising a second electrode layer disposed at the light-emitting surface, the portion of the diaphragm body distributed at the non light-filtering area stacked on top of the second electrode layer.

8. The display panel pixel unit of claim 1, wherein the light-filtering layer comprises:
a light polarizer layer distributed only in the light-filtering area; and
a ¼ wavelength film distributed only in the light-filtering area, and disposed stacked with the light polarizer layer.

9. The display panel pixel unit of claim 1, wherein the light-filtering layer comprises an anti-reflective film.

10. The display panel pixel unit of claim 1, wherein color light generated by the light-emitting element has an emission spectrum, and the wave band of the emission spectrum at least partially overlaps with the wave band of the transmittable spectrum of the light-filtering area.

11. The display panel pixel unit of claim 1, wherein the first electrode layer is formed as a cup shape, and includes a bottom portion and a cup sidewall surrounding the bottom portion, the light-emitting element is disposed on the bottom portion and surrounded by the cup sidewall, the light-filtering layer covers the area within the top end of the cup sidewall.

12. The display panel pixel unit of claim 7, wherein the light-emitting element partially covers the first electrode layer.

13. The display panel pixel unit of claim 1, further comprising a reflective polarizer film disposed below the light-filtering layer, and a space is between the reflective polarizer film and the first electrode layer; wherein the reflective polarizer film has a light-transmissible area corresponding to the light-emitting surface.

14. The display panel pixel unit of claim 13, further comprising a light-increasing film disposed on the reflective polarizer film below the light-filtering layer, wherein a space is between the light-increasing film and the first electrode layer.

15. A display panel, comprising a plurality of display panel pixel units of claim 1.

16. The display panel of claim 15, wherein a gapping band is between neighboring display panel pixel units, the light-filtering area of the light-filtering layer extends to cover the gapping band.

* * * * *